United States Patent
Yamashita (10) Patent No.: US 7,791,421 B2
(45) Date of Patent: Sep. 7, 2010

(54) SURFACE-MOUNTED PIEZOELECTRIC OSCILLATORS

(75) Inventor: Makoto Yamashita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 81 days.

(21) Appl. No.: 12/107,657

(22) Filed: Apr. 22, 2008

(65) Prior Publication Data

US 2008/0266003 A1 Oct. 30, 2008

(30) Foreign Application Priority Data

Apr. 26, 2007 (JP) .............................. 2007-116280

(51) Int. Cl.
*H03B 1/00* (2006.01)
(52) U.S. Cl. ..................... 331/68; 331/158; 310/311
(58) Field of Classification Search .................. 331/68, 331/158, 108 C, 108 D; 310/311, 348, 346, 310/349, 351, 365, 366
See application file for complete search history.

(56) References Cited

U.S. PATENT DOCUMENTS

2004/0135474 A1* 7/2004 Koyama et al. ............. 310/348
2004/0140856 A1* 7/2004 Bang et al. ................... 331/68
2006/0055478 A1* 3/2006 Isimaru ....................... 331/158
2006/0238080 A1* 10/2006 Koyama et al. ............. 310/348
2007/0247029 A1* 10/2007 Maruyama .................. 310/348
2008/0068102 A1* 3/2008 Moriya et al. ................ 331/68

FOREIGN PATENT DOCUMENTS

| JP | 07-336179 | | 12/1995 |
|---|---|---|---|
| JP | 08307153 A | * | 11/1996 |
| JP | 09-116047 | | 5/1997 |
| JP | 10-079577 | | 3/1998 |
| JP | 2001094378 A | * | 4/2001 |
| JP | 2002-329839 | | 11/2002 |
| JP | 2006-196854 | | 7/2006 |
| JP | 2007-043732 | | 2/2007 |

* cited by examiner

*Primary Examiner*—Robert Pascal
*Assistant Examiner*—Ryan Johnson
(74) *Attorney, Agent, or Firm*—Klarquist Sparkman, LLP (57) ABSTRACT

Surface-mounted piezoelectric oscillators are disclosed that include a package in which a piezoelectric vibrating piece and an electronic circuit (IC) are mounted. At least two external terminals are formed on the external surface of the package and electrically connected to the piezoelectric vibration piece and the electronic circuit. The front surfaces of the external terminals are recessed inwardly ($\Delta Z$) from the external surface of the package.

22 Claims, 5 Drawing Sheets

SURFACE-MOUNTED PIEZOELECTRIC OSCILLATORS

CROSS-REFERENCE TO RELATED APPLICATION

This application claims priority to, and the benefit of, Japan Patent Application No. 2007-116280, filed on 26 Apr. 2007 in the Japan Patent Office, the disclosure of which is incorporated by reference herein in its entirety.

FIELD

The present invention relates to piezoelectric oscillators and especially to packaged surface-mounted piezoelectric oscillators comprising an oscillating circuit inside of the package.

DESCRIPTION OF THE RELATED ART

Since a piezoelectric oscillator such as a crystal oscillator has a high level of frequency characteristic, it is often surface-mounted to a printed base plate. In response to integration requirements, piezoelectric oscillators have been miniaturized for mounting to a printed base plate. Also, chip components such as a bare chip or capacitor for an oscillating circuit, arranged inside the package of a piezoelectric oscillator, have been reduced in size. When a smaller bare chip or chip component is mounted in the package of a piezoelectric oscillator, a flip-chip bonding technique is generally used, as disclosed in Japan Unexamined Patent Application No. 1995-336179. Electrically conductive adhesive is usually used for attaching a chip component.

Whenever a bare chip or chip component is mounted inside a package, positioning is very important. To achieve correct positioning, the package is held by a vacuum chuck to prevent tilt or dislocation of the package. However, because external terminals of the package are metalized by screen printing, the thickness of the external terminals varies widely from one to the next.

If the thickness of the external terminals varies-widely, the package tilts even when held by a vacuum chuck as flip-chip bonding is being conducted. Therefore, there is a problem in that a bare chip cannot be mounted at an appropriate position relative to the external terminals of the package.

One purpose of the present invention is to provide methods in which a package does not tilt as a bare chip or chip component is being mounted on the package. Another purpose is to provide methods enabling bulk-scale production of piezoelectric oscillators of which package size is easily miniaturized.

SUMMARY

To achieve the above-mentioned purposes, a surface-mounted piezoelectric oscillator, according to a first aspect, comprises a package in which a piezoelectric vibrating piece is mounted. An electronic circuit is also mounted in the package. External terminals (at least two) are formed on the external surface of the package and electrically connected to the piezoelectric vibrating piece and the electronic circuit. The front surfaces of the external terminals are recessed inwardly relative to the external surface of the package.

The surface-mounted piezoelectric oscillator according to the first aspect has external terminals. The front surfaces of the external terminals are recessed inwardly from the external surface of the package so that the package does not tilt when it is being held on a base plate or a table.

In a surface-mounted piezoelectric oscillator according to a second aspect, the front surfaces of the external terminals are recessed 3-50 micrometers inwardly from the external surface of the package. By recessing the front surfaces of the external terminals inwardly by at least 3 micrometers, the package does not tilt whenever the package is being held on a base plate or a table. By recessing the front surfaces of the external terminals inwardly by no more than 50 micrometers, the piezoelectric oscillator, mounted on the printed base plate by a solder paste, can be affixed tightly.

The surface-mounted piezoelectric oscillator according to the third aspect comprises a ceramic package made from a green sheet, wherein the external terminals are formed by printing a metal paste on the green sheet. For fabricating the package of the piezoelectric oscillator, alumina or glass ceramic is preferably used because these materials exhibit good resistance to effects of temperature change and temporal changes of frequency.

The surface-mounted piezoelectric oscillator according to the fourth aspect comprises a package whose bottom surface is rectangular in shape. The external terminals are formed at the center of each side of the rectangular surface. The surface-mounted piezoelectric oscillator of the fourth aspect is desirable for mounting to a printed base plate using solder paste. Because the four corners of the piezoelectric oscillator contact and rest on the plate surface when the oscillator is being affixed, the oscillator is mounted on the printed base plate with good positioning.

The surface-mounted piezoelectric oscillator according to the fifth aspect comprises a package of which an interior space is filled with an inert gas or a vacuum atmosphere. Whenever the interior space is filled with inert gas or a vacuum atmosphere, the oscillator exhibits good resistance to effects of temperature change and resists temporal changes of frequency.

According to a sixth aspect, a surface-mounted piezoelectric oscillator is provided in which an electric circuit is mounted in the package in a flip-chip bonding manner. The flip-chip bonding method allows the electric circuit to be reduced in size. By using flip-chip bonding, the electric circuit is aligned parallel to the surface of the package for mounting on the package, so the package needs to be held securely. Since the front surfaces of external terminals are recessed inwardly from the external surface of the package, the package does not tilt and is readily held by vacuum-suction.

According to a seventh aspect, the piezoelectric vibrating piece is mounted in a first cavity of the package, and the electronic circuit is mounted in a second cavity that is separated from the first cavity. The surface-mounted piezoelectric oscillator of the seventh aspect allows accommodation of the piezoelectric vibrating piece and the electric circuit in separated spaces. This aspect also allows miniaturization and production efficiency. Also, the electric circuit is easy to mount in this embodiment.

The present invention provides surface-mounted piezoelectric oscillators of which the package is resistant to tilt, that enables bulk-production, and that achieves package miniaturization easily.

DESCRIPTION OF PREFERRED EMBODIMENTS

Manufacturing methods and apparatus for making various embodiments of piezoelectric oscillators according to the present invention are explained as follows.

Configuration of Ceramic Package

Figure 1A:
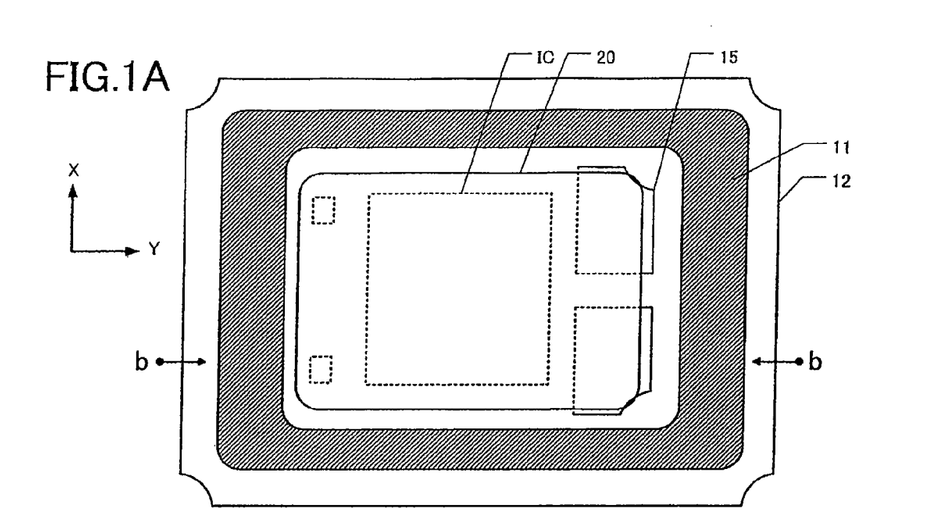
FIG. 1A is a top view of a first embodiment of a piezoelectric oscillator 10 of which the metal cap 19 is removed.
Figure 1B:
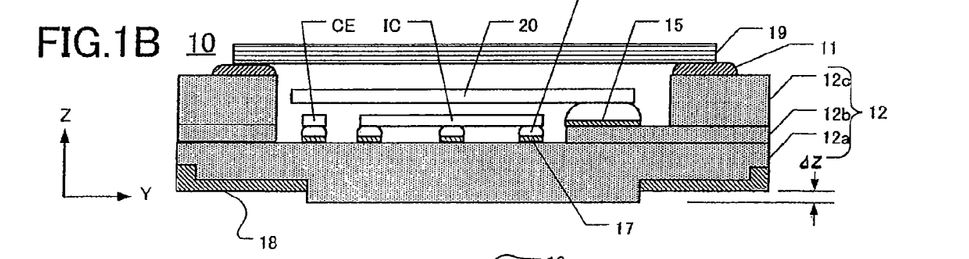
FIG. 1B is a cross-sectional view taken along line b-b of the oscillator illustrated in FIG. 1A.
Figure 1C:
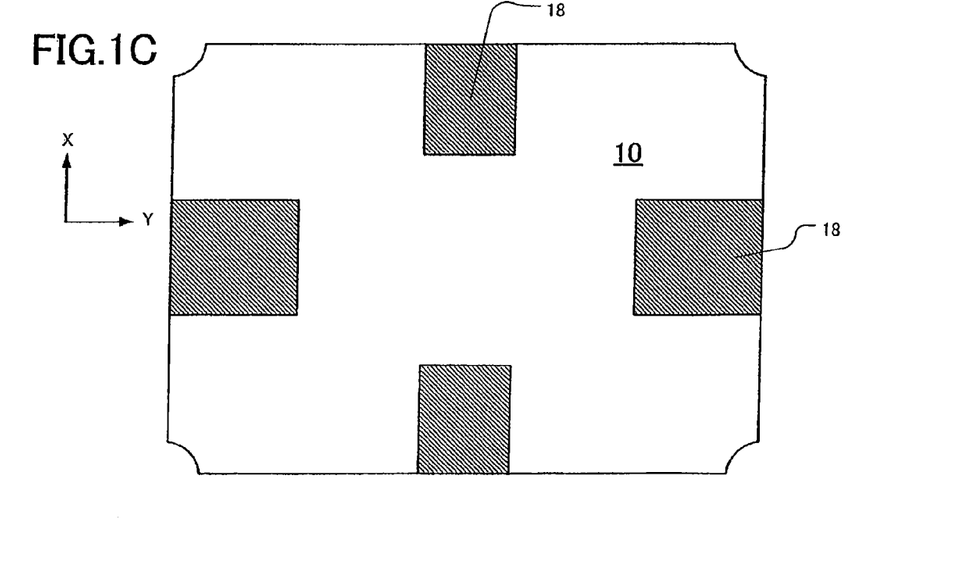
FIG. 1C is a back-side view of the first embodiment of a piezoelectric oscillator 10.

FIG. 1A is a top view of a first embodiment of a piezoelectric oscillator 10, of which a metal cap 19 is removed. FIG. 1B is a cross-sectional view taken along the line b-b of FIG. 1A. FIG. 1C is a back-side view of the first embodiment 10.

The first embodiment of a piezoelectric oscillator 10 comprises a ceramic package 12 comprising a tabular bottom sheet 12a, a mount sheet 12b (formed as layer of the bottom sheet 12a), and a side sheet 12c. On top of the side sheet 12c, a seal 11 is formed and a metal cap 19 is mounted to the seal. The size of the first piezoelectric oscillator 10 is, for example, 2.5 mm long×2.0 mm wide, 2.0 mm long×1.6 mm wide, or 1.6 mm long×1.2 mm wide. The bottom sheet 12a, the mount sheet 12b, and/or the side sheet 12c comprise a ceramic base plate called a green sheet before it is fired. The thickness of the green sheet is not particularly determined and can be established based on intended usage. For example, the thickness of the green sheet can be generally 0.1 to 2 mm, preferably 0.2 to 0.6 mm.

Inside the ceramic package 12 (on top of the bottom sheet 12a), wiring 17 is formed for mounting a bare-chip IC or a chip component CE. The bare-chip IC has a plurality of terminals. The wiring 17 corresponding to the terminals is formed on top surface of the bottom sheet 12a. Also, the wiring 17 corresponding to the chip component CE (comprising an oscillating circuit) is formed on the bottom sheet 12a. In addition, corresponding to a position of the connecting electrode of a piezoelectric vibrating piece 20 mounted on the ceramic package 12, a mount electrode 15 is formed on the mount sheet 12b.

The wiring 17 or the mounting electrode 15 for the bare-chip IC is connected electrically to the surface-mounted external terminals 18 formed on the back surface (under surface) of the ceramic package 12, that is, the bottom of the bottom sheet 12a via a conductive portion. Four of the external terminals 18 are formed as shown in FIG. 1C. The first embodiment of a piezoelectric oscillator 10 has generally more than two and less than ten external terminals 18. The external terminals 18 are formed of a conductive paste, such as molybdenum (Mo) or tungsten (W), using a screen, calendar, or pad-printing technique. The thickness of the conductive paste, as made, is generally (but not limited to) 1 to 100 micrometers, preferably 5 to 30 micrometers.

With miniaturization, the bare-chip IC is mounted by a flip-chip bonding manner that eliminates the need for connecting wires to and from the IC. Flip-chip bonding is a mounting method involving attachment of gold (Au) bumps to the bare-chip IC and connecting the bumps directly to a base plate such as of a ceramic package. Ultrasonic bonding can be used for connecting the chip to the base plate via the gold bumps. The method involves application of pressure to the base plate and application of ultrasonic vibration to the IC in a parallel direction during mounting. For the flip-chip mounting technique, the surface of the bare-chip IC (on which the gold bumps Au are formed) and the wiring surface need to be parallel to each other. If the surface of the bare-chip IC and the wiring surface are tilted with respect to each other, they may not be connected well. Note that the piezoelectric vibrating piece 20 and the chip component CE are generally mounted using an electrically conductive adhesive ADH.

Regarding the first embodiment of a piezoelectric oscillator 10 of FIG. 1, after the bare-chip IC and the chip component CE are mounted, the piezoelectric vibrating piece 20 is mounted. Then, in a chamber maintained at a particular vacuum or that contains a desired inert gas, the metal cap 19 is attached to the top surface of the seal 11 on the ceramic package 12. Thus, the seal 11 seals the package of the piezoelectric oscillator 10. The atmosphere inside the package of the first piezoelectric oscillator 10 is filled with the inert gas or the vacuum atmosphere.

As FIG. 1B shows, the front surfaces of the external terminals 18 are recessed a distance $\Delta Z$ from the external surface of the bottom sheet 12a. The front surfaces of the external terminals 18 can be formed along the external surface, or inwardly from the external surface, of the bottom sheet 12a. But, the front surfaces preferably are recessed 3 to 50 micrometers inwardly from the external surface of the bottom sheet 12a. If the recess is more than 50 micrometers, when the first piezoelectric oscillator 10 is mounted on the printed base plate 20 (see FIG. 2) using solder paste, the oscillator may not achieve contact with the external terminals 18 because the solder paste will not be thick enough. More preferably, the front surfaces of the external terminals 18 are recessed by 3 to 30 micrometers inwardly from the external surface of the bottom sheet 12a.

As the front surfaces of the external terminals 18 are fired, some parts of the fired surface may become bumpy. Also, using a screen-printing technique, it is difficult to make the fired surfaces of the external terminals 18 flat. Consequently, the surface height of some of the external terminals 18 may differ from other external terminals 18. Whenever the heights of the front surfaces of some of the external terminals are different from the heights of front surfaces of other external terminals, the ceramic package 12 tilts. But, because the first embodiment of a piezoelectric oscillator of FIG. 1 is formed such that the front surfaces of the external terminals 18 are not above the external surface of the bottom sheet 12a (even if the heights of the front surfaces of individual external terminals 18 vary one to another), the ceramic package does not tilt.

As shown in FIG. 1C, the bottom surface of the first embodiment of a piezoelectric oscillator 10 has a rectangular shape. The external terminals 18 are formed near the center of each side. The external terminals 18 have dimensions of 0.6 mm×0.4 mm. If the size of the first piezoelectric oscillator 10 is 2.5 mm×2.0 mm, then about 19% of the area of the base of the piezoelectric oscillator is occupied by the external terminals 18. If the dimensions of the first embodiment of a piezoelectric oscillator 10 are decreased to 2.0 mm×1.6 mm, or to 1.6 mm×1.6 mm, the size of the external terminals 18 does not decrease proportionally due to the relationship between the printed base plate 90 and the lead wiring 94. Therefore, as the size of the first embodiment of the piezoelectric oscillator 10 is reduced, the percentage of area occupied by the external terminals 18 is increased.

Back (Under) Surface of Another Ceramic Package

Figure 2A:
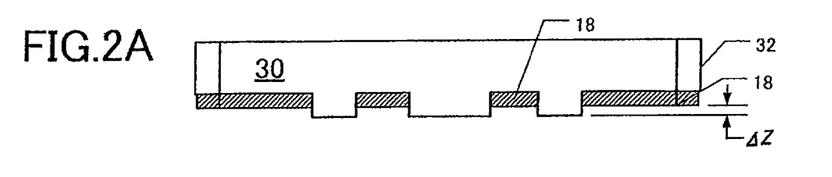
FIG. 2 shows a second embodiment of a piezoelectric oscillator 30 having a different external shape from the first embodiment of a piezoelectric oscillator 10.
Figure 2B:
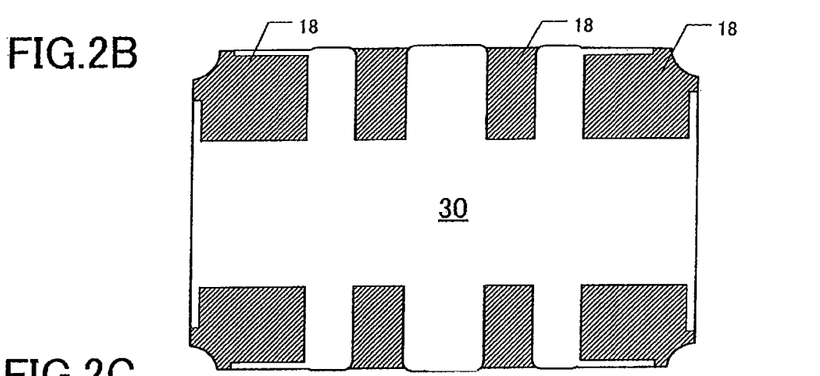
Figure 2C:
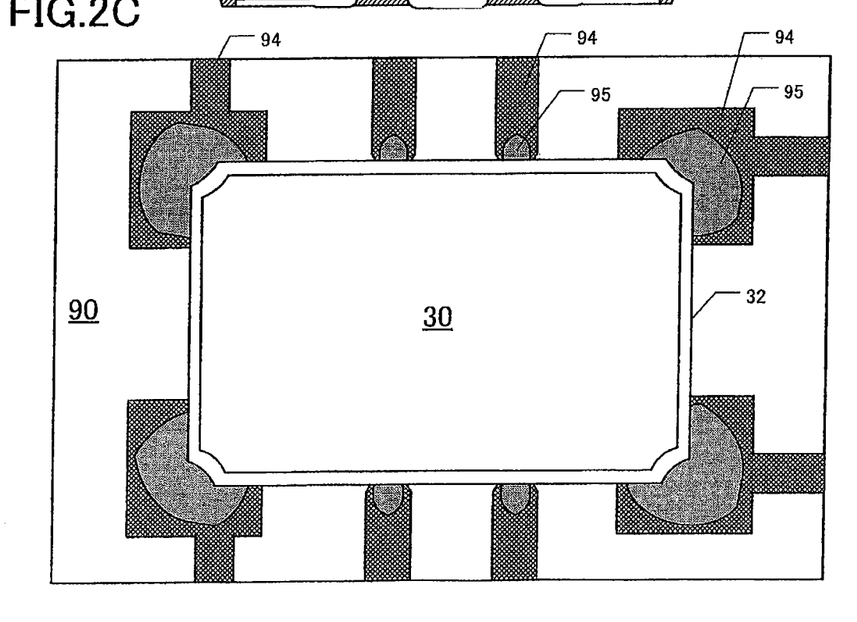

FIG. 2 shows a second embodiment of a piezoelectric oscillator 30 that has a different shape from the first embodiment of a piezoelectric oscillator 10 of FIG. 1. FIG. 2A is a side view of the ceramic package 32 of the second embodiment, and FIG. 2B is a back (under) surface of the second embodiment. FIG. 2C is a top view of the second embodiment of piezoelectric oscillator 30, as affixed by a solder paste 95 on a printed base plate 90 on which several other electric devices can be mounted.

As shown in FIG. 2B, on the second embodiment of a piezoelectric oscillator 30, the external terminals 18 on the four corners of the rectangle have dimensions of about 0.6 mm×0.4 mm, and the external terminals 18 on the two longitudinal sides have dimensions of about 0.2 mm×0.4 mm. In FIG. 2C, on the printed base plate 90, the lead wiring 94 is formed by etching. The second embodiment of a piezoelectric oscillator 30 is affixed on the lead wiring 94 using solder paste 95.

Regarding the first and second embodiments of a piezoelectric oscillator 10, 30, respectively, the front surfaces of the external terminals 18 are recessed a distance $\Delta Z$ inwardly from the external surface of the bottom sheet 12*a*. The amount of recess desirably is 3 to 50 micrometers inwardly from the external surface of the bottom sheet 12*a*. More preferably, the amount of recess is 3 to 30 micrometers inwardly from the external surface of the bottom sheet 12*a*. Even with a recess of 50 micrometers inwardly from the external surface of the bottom sheet 12*a*, the external terminals 18 are affixed tightly by the solder past 95 to the lead wiring 94 of the printed base plate 90. After the second embodiment of a piezoelectric oscillator 30 is mounted on the printed base plate 90 (coated with solder paste 95) and passed through a reflow furnace, the surface-mounted second piezoelectric oscillator 30 is affixed to the printed base plate 90 by solder.

Figure 3:
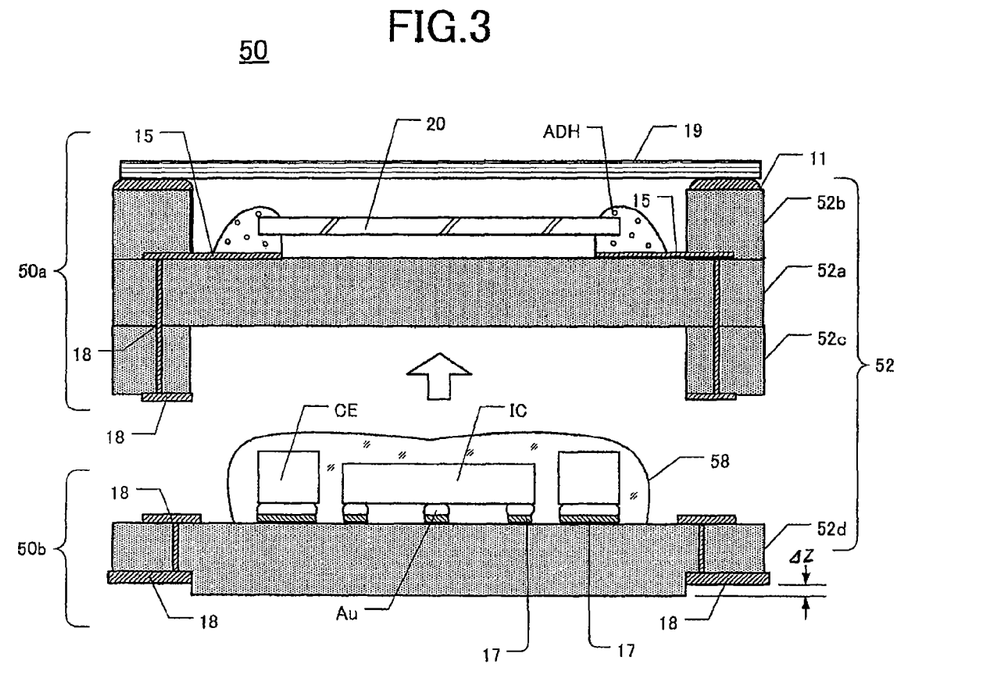
FIG. 3 is a cross-sectional view of a third embodiment of a piezoelectric oscillator 50 having a different external shape from the first embodiment of a piezoelectric oscillator 10.

FIG. 3 shows a cross-sectional view of a third embodiment of a piezoelectric oscillator 50 which has a different outer shape than the first embodiment 10.

The third embodiment 50 comprises an upper package 50*a* and a bottom package 50*b*. The upper package 50*a* is formed in an integrated manner by layering and firing three green sheets. The upper package 50*a* has an upper side surface sheet 52*b* and a bottom side sheet 52*c* on opposite sides of a center sheet 52*a*. On the center sheet 52*a*, the piezoelectric vibrating piece 20 is attached using electrically conductive adhesive ADH. Then, in a chamber evacuated to a desired vacuum level or containing an inert gas, the metal cap 19 is attached to the seal 11 on top of the upper sheet 52*b*, thereby hermetically sealing the third piezoelectric oscillator 50.

The bottom package 50*b* is formed by firing one green sheet. The bottom package 50*b* contains the mounted bare-chip IC and the chip component CE on the bottom sheet 52*b*. The bare-chip IC is attached by ultrasonic flip-chip bonding. The chip component CE is affixed using electrically conductive adhesive ADH. A fusion resin 58 is coated over the bare-chip IC and the chip component CE, and then the bottom package 50*b* is affixed to the upper package 50*a*. Thus, the third embodiment of a piezoelectric oscillator 50 comprises a first cavity on the center sheet 52*a*, accommodates the piezoelectric vibrating piece 20 in the first cavity, comprises a second cavity beneath the center sheet 52*a*, and accommodates the piezoelectric vibrating piece 20, the bare-chip IC, and the chip component CE in the second cavity.

The front surfaces of the external terminals 18 formed on the bottom sheet 52*b* desirably are recessed 3-50 micrometers inwardly from the bottom sheet 52*d*. Because the external surface of the bottom sheet 52*b* is flat, the bottom package 50*b* does not tilt. Thus, when the bare-chip IC is mounted on the bottom sheet 52*b* by ultrasonic flip-chip bonding, the surface of the bare-chip IC on which the gold bumps Au are formed is parallel to the wiring surface.

The mounting electrode 15 of the piezoelectric vibrating piece 20 is connected to an internal terminal of the wiring 17 of the bare-chip IC via a so-called through-hole. Then, one or more other terminals for output, power source, and ground of the bare-chip IC are connected to the surface-mounted external terminals 18 by the chip component CE or by the wiring 17.

Mounting Bare Chip for a Piezoelectric Oscillator

Figure 4A:
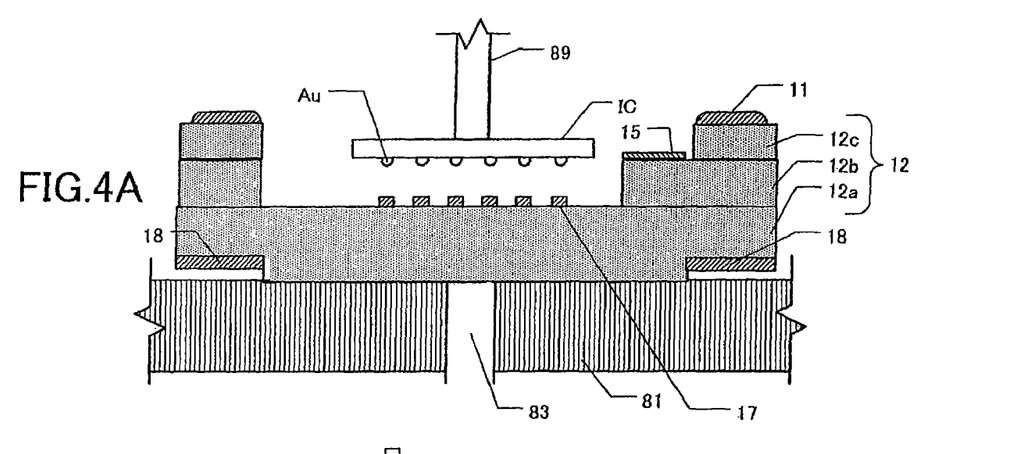
FIG. 4A shows a ceramic package 12 mounted on a mounting table 81.
Figure 4B:
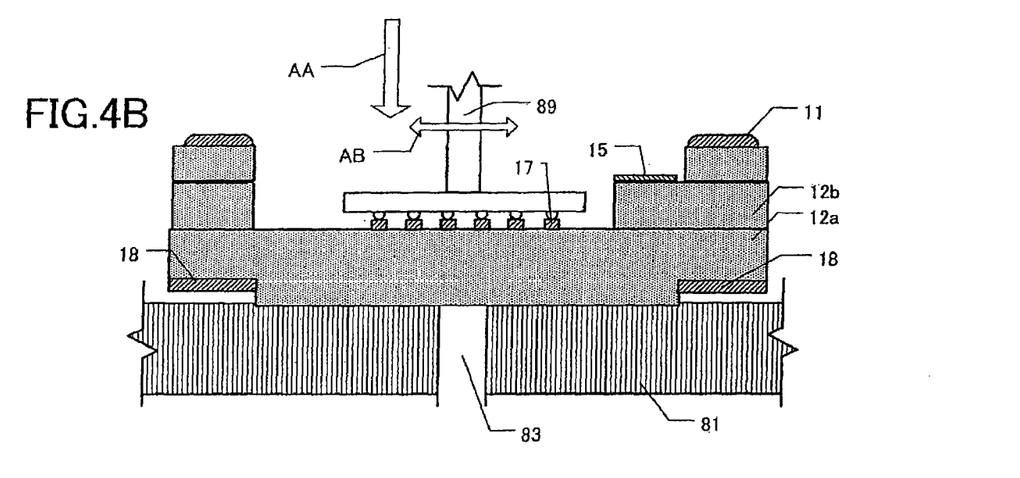
FIG. 4B shows a bare-chip IC being positioned based on the image-processing result shown by the arrow AA.

FIG. 4 is a cross-sectional view of a process for mounting the bare-chip IC on the ceramic package 12 of the first embodiment of a piezoelectric oscillator 10. In FIG. 4A, the ceramic package 12 is mounted on a mounting table 81. The mounting table 81 has a vacuum-suction hole 83 by which to apply vacuum-suction to the ceramic package 12. The vacuum-suction hole 83 is connected to a vacuum pump (not shown). The ceramic package 12 is mounted on the mounting table 81 and fixed by vacuum-suction. Image-processing is performed using an alignment camera (not shown), and alignment of the ceramic package 12 with the wiring 17 in the ceramic package 12 is thus verified.

Figure 4C:
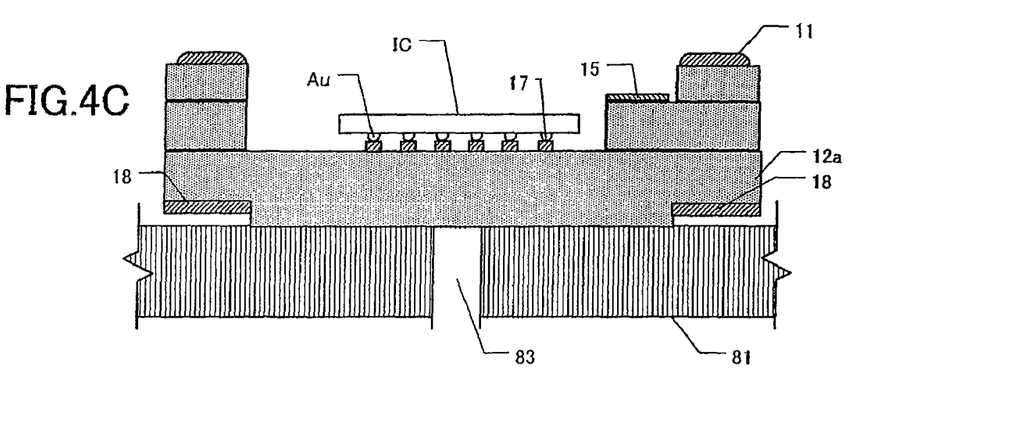
FIG. 4C shows that the vacuum-suction hole 83 is also stopped along with the stoppage of vacuum chuck 89.

Then, the bare-chip IC is chucked by a vacuum chuck with the side including the gold bumps Au facing downward. As indicated by the arrow AA in FIG. 4B, the bare-chip IC is placed based on the result of the image-processing. When the gold bumps Au of the bare-chip IC contact the wiring 17, the vacuum chuck 89 applies an ultrasound vibration in the horizontal direction as indicated by the arrow AB to connect the bare-chip IC to the wiring 17. Then, as shown in FIG. 4C, turning off vacuum to the vacuum chuck 89 is accompanied by turning off the vacuum-suction being applied to the vacuum-suction hole 83. Then, to hold the bare-chip IC tightly, an underfill (not illustrated) is introduced.

In FIG. 4, since the front surfaces of the external terminals 18 as formed on the ceramic package 12 are recessed by 3-50 micrometers inwardly, the bottom sheet 12*a* can be affixed tightly to the mounting table 81 by application of vacuum-suction via the vacuum-suction hole 83. As a result, even when ultrasonic vibration is applied in the horizontal direction to the bare-chip IC (arrow AB), the ceramic package 12 does not move.

Making the Bottom Sheet

Figure 5A:
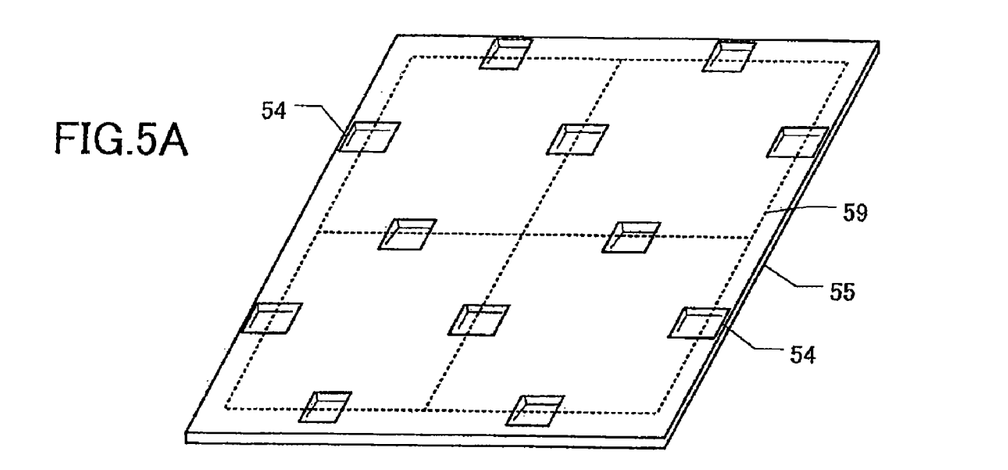
FIG. 5 shows a method for making of the bottom sheet 52d of the third embodiment of a piezoelectric oscillator 50.

FIG. 5 shows a method for making the bottom sheet 52*d* of the third embodiment of a piezoelectric oscillator. FIG. 5A shows a large green sheet 55 made of alumina. The thickness of the green sheet is, for example, 0.4 mm. The lattice-like dashed lines are parting lines 59 denoting virtual lines of expected separation. The figure shows separation into four parts, but actually the separation is into dozens or several hundreds of parts. The sheet portion surrounded by the parting lines 59 has a rectangular shape with sides 2.5 mm×2.0 mm. As shown by FIG. 5A, on the green sheet 55 (along the parting lines 59) are groove portions 54 of rectangular shape formed using an embossing machine. The depth of the groove portions 54 is about 40 to about 60 micrometers.

Figure 5B:
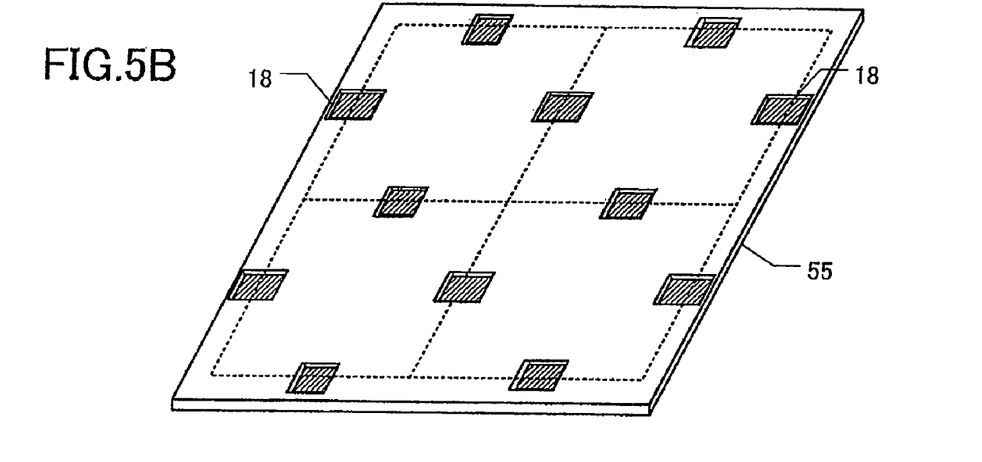

Next, as shown in FIG. 5B, a conductive paste, such as molybdenum (Mo) and tungsten (W), is coated by screen printing, calendar printing, or pad printing on the groove portions 54 (embossed by a mask, not shown) of the large green sheet 55. For example, the thickness of the printed conductive paste is about 20 to 30 micrometers.

Figure 5C:
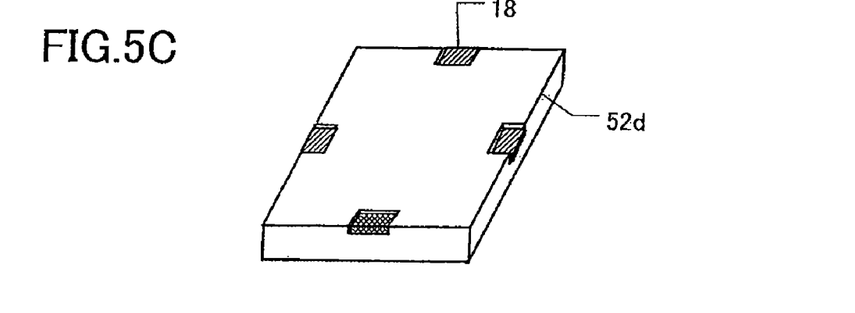

Next, by cutting the large green sheet 55 in line with the parting lines 59 and firing at about 1500° C. for a predetermined number of hours, each sheet part becomes the bottom sheet 52d having external terminals 18, as shown in FIG. 5C. The depth of the embossed groove portions are about 40 to 60 micrometers, and the thickness of the coated conductive paste is about 20 to 30 micrometers. As a result, the finished front surfaces of the external terminals 18 are recessed 10 to 30 micrometers inwardly from the external surface of the bottom sheet 52d. Note that the foregoing is explained with the assumption that the green sheet does not shrink by firing. If the green sheet 55 does shrink from being fired, the embossing size can be established with consideration of the percentage of shrinkage.

In the foregoing description, the green sheet 55 is fired after it is cut along the parting lines 59. But, the bottom sheet 52b can be formed by an alternative technique. For example, a large green sheet 55 can be fired and then cut along the parting lines 59.

The foregoing description is made with the assumption that the first, second, and third embodiments of a piezoelectric oscillator 10, 30, 50, respectively, comprise an alumina ceramic package. Alternatively, the package can be a glass ceramic package or a resin package.

Also, in this embodiment, for mounting the bare-chip IC to the package, an ultrasonic bonding method was used. Alternative mounting methods are the C4 method, the ESC (Epoxy Encapsulated Solder Connection) method, the MBB (Micro Bump Bonding) method of insulation formula, or SBB (Stud Bump Bonding) method of stud bump plus electrically conductive adhesive formula. In any of these methods, a piezoelectric oscillator having external terminals recessed inwardly from the external surface of the package is easy to handle.

This embodiment was described in connection with an example of the bare-chip IC, which is advantageous for miniaturization. But, the piezoelectric oscillator can be used with a semiconductor element besides a bare-chip IC. For example, when a COB (Chip On Board) element is wire-connected by wire bonding, the assembly is easy to hold by vacuum-suction if the external terminals are recessed inwardly from the external surfaces of the ceramic package. Wire-bonding involves making wire connections using gold (Au) wire or aluminum (Al) wire, with the wire diameter being a few microns. A nozzle called a capillary (not shown) is used as a guide, producing connections of the COB element and the wiring.

Also, this embodiment was described with reference to an example of a piezoelectric oscillator using a bare-chip IC. An alternative configuration is a piezoelectric oscillator lacking a bare-chip IC.

Whereas the invention has been described with reference to representative embodiments, it will be understood that it is not limited to those embodiments. On the contrary, the invention is intended to encompass all alternatives, modifications, and equivalents as may be included within the spirit and scope of the invention, as defined by the appended claims.

What is claimed is:

1. A surface-mounted piezoelectric oscillator, comprising:
   a package including an external bottom surface defining at least three recess portions;
   a piezoelectric vibrating piece and an electronic circuit mounted inside the package; and
   at least three external terminals conducting at least power and ground to, and output from, the piezoelectric vibrating piece and electronic circuit, each external terminal being formed of a conductive paste by printing in a respective one of the recess portions such that each recess portion includes a respective external terminal, the external terminals being electrically connected to the piezoelectric vibration piece and to the electronic circuit, and each external terminal having a respective front surface that is fully recessed inwardly from the external bottom surface of the package.

2. The surface-mounted piezoelectric oscillator of claim 1, wherein the package defines an interior filled with an inert gas or a vacuum atmosphere.

3. The surface-mounted piezoelectric oscillator of claim 1, wherein the electronic circuit is mounted in a flip-chip bonding manner.

4. The surface-mounted piezoelectric oscillator of claim 1, wherein:
   the package defines a first cavity in which the piezoelectric vibrating piece is mounted; and
   the package defines a second cavity separate from the first cavity; and
   the electronic circuit is mounted in the second cavity.

5. The surface-mounted piezoelectric oscillator of claim 1, mounted to a printed base plate.

6. The surface-mounted piezoelectric oscillator of claim 1, wherein the respective front surface of each of the external terminals is recessed 3 to 50 micrometers inwardly from the external bottom surface of the package.

7. The surface-mounted piezoelectric oscillator of claim 6, wherein:
   the package comprises at least one portion made from a fired ceramic green sheet; and
   the external terminals comprise metal paste printed on the green sheet.

8. The surface-mounted piezoelectric oscillator of claim 6, wherein:
   the external bottom surface has a rectangular shape; and
   each respective external terminal is situated at a center of a respective side of the rectangular shape.

9. The surface-mounted piezoelectric oscillator of claim 6, wherein the package defines an interior filled with an inert gas or a vacuum atmosphere.

10. The surface-mounted piezoelectric oscillator of claim 6, wherein the electronic circuit is mounted in a flip-chip bonding manner.

11. The surface-mounted piezoelectric oscillator of claim 6, wherein:
   the package defines a first cavity in which the piezoelectric vibrating piece is mounted; and
   the package defines a second cavity separate from the first cavity; and
   the electronic circuit is mounted in the second cavity.

12. The surface-mounted piezoelectric oscillator of claim 1, wherein:
   the package comprises at least one portion made from a fired ceramic green sheet; and
   the external terminals comprise metal paste printed on the green sheet.

13. The surface-mounted piezoelectric oscillator of claim 12, wherein:
   the external bottom surface has a rectangular shape; and
   each respective external terminal is situated at a center of a respective side of the rectangular shape.

14. The surface-mounted piezoelectric oscillator of claim 12, wherein the package defines an interior filled with an inert gas or a vacuum atmosphere.

15. The surface-mounted piezoelectric oscillator of claim 12, wherein the electronic circuit is mounted in a flip-chip bonding manner.

16. The surface-mounted piezoelectric oscillator of claim 7, wherein the package defines an interior filled with an inert gas or a vacuum atmosphere.

17. The surface-mounted piezoelectric oscillator of claim 7, wherein the electronic circuit is mounted in a flip-chip bonding manner.

18. A surface-mounted piezoelectric oscillator, comprising:
   a package including an external bottom surface defining at least three recess portions;
   a piezoelectric vibrating piece and an electronic circuit mounted inside the package; and
   at least three external terminals conducting at least power and ground to, and output from, the vibrating piece and electronic circuit, each external terminal being formed on a respective one of the recess portions such that each recess portion includes a respective external terminal, the external terminals being electrically connected to the piezoelectric vibrating piece and to the electronic circuit, and each external terminal having a respective front surface that is fully recessed inwardly from the external bottom surface of the package,
   wherein the external bottom surface of the package has a rectangular shape; and
   each respective external terminal is situated at a center of a respective side of the rectangular shape.

19. The surface-mounted piezoelectric oscillator of claim 18, wherein the electronic circuit is mounted in a flip-chip bonding manner.

20. A method for fabricating a surface-mountable piezoelectric oscillator, comprising:
   mounting a piezoelectric vibrating piece and an electronic circuit to at least one first package element such that the electronic circuit is electrically connected to the piezoelectric vibrating piece;
   attaching at least one second package element to the at least one first package element to form a package enclosing the piezoelectric vibrating piece and electronic circuit in at least one space defined by the package, the package having an external bottom surface;
   defining at least three recess portions on the external bottom surface;
   forming at least three external terminals, conducting at least power and ground to, and output from, the vibrating piece and electronic circuit, the external terminals being formed in the external bottom surface of the package such that each recess portion has a respective external terminal, each external terminal being formed of a conductive paste in a printing manner such that the external terminals are electrically connected to the piezoelectric vibrating piece and the electronic circuit, each external terminal being fully recessed inwardly in the respective recess portion from the external bottom surface of the package.

21. The method of claim 20, wherein the electronic circuit is defined on a chip, the method further comprising applying vacuum-suction to the package; and mounting the chip in a flip-chip manner in the package.

22. The method of claim 20, further comprising:
   placing the piezoelectric vibrator on a base plate printed with conductive wiring;
   aligning the external terminals with the conductive wiring; and
   attaching the piezoelectric vibrator on the base plate such that the external terminals are conductively bonded to the conductive wiring.

* * * * *